(12) United States Patent
Ikeda et al.

(10) Patent No.: US 7,642,179 B2
(45) Date of Patent: Jan. 5, 2010

(54) SEMICONDUCTOR SUBSTRATE AND MANUFACTURING METHOD FOR THE SAME

(75) Inventors: Hajime Ikeda, Chigasaki (JP); Kazuya Notsu, Chigasaki (JP); Nobuhiko Sato, Sagamihara (JP); Shoji Nishida, Hiratsuka (JP)

(73) Assignee: Canon Kabuhsiki Kaisha, Tokyo (JP)

( * ) Notice: Subject to any disclaimer, the term of this patent is extended or adjusted under 35 U.S.C. 154(b) by 406 days.

(21) Appl. No.: 11/199,597

(22) Filed: Aug. 8, 2005

(65) Prior Publication Data

US 2006/0035447 A1 Feb. 16, 2006

(30) Foreign Application Priority Data

Aug. 11, 2004 (JP) ............................. 2004-234353
Apr. 21, 2005 (JP) ............................. 2005-123984

(51) Int. Cl.
*H01L 21/20* (2006.01)
(52) U.S. Cl. .................... 438/509; 438/488; 438/489; 438/492; 438/493; 438/507
(58) Field of Classification Search ......... 438/488–489, 438/492, 493, 507, 509
See application file for complete search history.

(56) References Cited

U.S. PATENT DOCUMENTS

| | | | | |
|---|---|---|---|---|
| 5,210,052 A | * | 5/1993 | Takasaki | ..................... 438/509 |
| 5,212,394 A | * | 5/1993 | Iwasaki et al. | ............. 428/66.7 |
| 5,810,924 A | * | 9/1998 | Legoues et al. | ................ 117/89 |
| 6,143,629 A | * | 11/2000 | Sato | ........................... 438/455 |
| 6,503,773 B2 | | 1/2003 | Fitzgerald | ..................... 438/37 |
| 7,147,709 B1 | * | 12/2006 | Ong et al. | ....................... 117/3 |
| 2004/0259315 A1 | * | 12/2004 | Sakaguchi et al. | .......... 438/285 |
| 2005/0221507 A1 | * | 10/2005 | Koo et al. | .................... 436/525 |
| 2005/0221591 A1 | * | 10/2005 | Bedell et al. | ................. 438/479 |
| 2006/0046511 A1 | * | 3/2006 | Shibata et al. | .............. 438/767 |

FOREIGN PATENT DOCUMENTS

JP 2002-217116 8/2002

* cited by examiner

*Primary Examiner*—Kevin M Picardat
*Assistant Examiner*—Bac H Au
(74) *Attorney, Agent, or Firm*—Canon U.S.A., Inc., IP Division

(57) ABSTRACT

A method of manufacturing a semiconductor substrate includes a growing step of growing a second single crystalline semiconductor on a first single crystalline semiconductor, a blocking layer forming step of forming a blocking layer on the second single crystalline semiconductor, and a relaxing step of generating crystal defects at a portion deeper than the blocking layer to relax a stress acting on the second single crystalline semiconductor. The blocking layer includes, e.g., a porous layer, and prevents the crystal defects at the portion deeper than the blocking layer from propagating to the surface of the second single crystalline semiconductor.

15 Claims, 7 Drawing Sheets

FIG. 1

| SUBSTRATE | | HETERO EPITAXIAL LAYER | |
|---|---|---|---|
| MATERIAL | LATTICE CONSTANT (Å) | MATERIAL | LATTICE CONSTANT (Å) |
| Si | 5.4310 | GaP | 5.4505 |
| | | AlP | 5.4635 |
| | | CaF$_2$ | 5.4638 |
| Ge | 5.6579 | GaAs | 5.65325 |
| | | AlAs | 5.660 |
| | | ZnSe | 5.668 |
| | | ErAs | 5.7427 |
| InP | 5.8694 | CdS | 5.825 |
| | | GdAs | 5.860 |
| GaSb | 6.094 | AlSb | 6.1355 |
| | | InAs | 6.0583 |
| | | ZnTe | 6.10 |
| | | CdSe | 6.052 |
| α-Sn | 6.4892 | InSb | 6.478 |
| | | CdTe | 6.482 |
| GaN | 3.180 (a) | AlN | 3.111(a) |
| | 5.166 (c) | | 4.980(c) |

FIG. 4

| FIRST SINGLE CRYSTALLINE SEMICONDUCTOR | | SECOND AND THIRD SINGLE CRYSTALLINE SEMICONDUCTORS | |
|---|---|---|---|
| MATERIAL | LATTICE CONSTANT (Å) | MATERIAL | LATTICE CONSTANT (Å) |
| Si | 5.4310 | GaP | 5.4505 |
| Ge | 5.6579 | GaAs | 5.65325 |
| GaSb | 6.094 | ZnTe | 6.10 |
| α-Sn | 6.4892 | CdTe | 6.482 |

EXHAUST

SEMICONDUCTOR SUBSTRATE AND MANUFACTURING METHOD FOR THE SAME

FIELD OF THE INVENTION

The present invention relates to a semiconductor substrate and a manufacturing method for the same.

BACKGROUND OF THE INVENTION

A technique for epitaxially growing on a single FIG. 1 shows examples of hetero epitaxial growth. In crystalline substrate a material different from the substrate is known as the hetero epitaxial technique. general, if the crystal structure of a substrate and that of a film to be formed on the substrate are similar and their lattice constants are close, the film can be epitaxially grown on the substrate. When, however, any difference in lattice constant exists, a stress is generated in the film formed by epitaxial growth. When the film thickness exceeds the critical film thickness, lattice shift (misfit dislocation) occurs to relax the stress.

For example, when SiGe is to be epitaxially grown on Si, as the lattice constant of Si is 5.43 Å and that of SiGe (Ge concentration: 20%) is 5.47 Å, a lattice mismatch of about 0.8% is present. As SiGe grows on the Si lattice, the lattice constant in the direction parallel to the lattice plane becomes equal to that of Si in the initial stage of the growth, and SiGe is deposited in a compressed state. When epitaxial growth is continued until the film thickness exceeds the critical film thickness, misfit dislocations occur. The critical film thickness differs depending on the epitaxial growth conditions and is approximately 50 nm to 300 nm. When epitaxial growth is further continued, the misfit dislocations gradually increase. When the film thickness reaches about 2 μm, occurrence of dislocations mostly ends. In this state, SiGe is free from strain because of a "shift" accompanying the misfit dislocations and accordingly does not receive any stress, so that its lattice constant is 5.47 Å. A misfit dislocation causes a threading dislocation the end of which reaches the surface of the epitaxial growth film. Accordingly, many threading dislocations (e.g., about $1 \times 10^7 / cm^2$) are present in the surface of the epitaxial growth film having a thickness of 2 μm. Defects such as threading dislocations impart adverse effects to devices, e.g., characteristic degradation, characteristic variations, and short service life.

U.S. Pat. No. 6,503,773 discloses a technique for changing the Ge concentration in the direction of depth and accordingly relaxing the stress stepwise to divert the defect growing direction to a direction parallel to the structure surface, thereby decreasing the density of threading dislocations in the uppermost surface. According to this technique, the density of threading dislocations in the surface can be decreased.

Japanese Patent Laid-Open No. 2002-217116 discloses a technique for performing etching during a hetero epitaxial step to form a recess at a position where a threading dislocation is expected to occur, and resuming the hetero epitaxial step after that to grow crystals while leaving the recess as a space. The space blocks the threading dislocation from propagating to the upper layer.

With the technique described in U.S. Pat. No. 6,503,773, to cause stepwise concentration change, SiGe must be inevitably deposited thick. Then, the throughput decreases, and the manufacturing cost increases. If SiGe is deposited thick while including a defect, surface microstructures increase inevitably. Hence, after the epitaxial step, planarization such as a CMP (Chemical Mechanical Polishing) process becomes necessary.

With the technique described in Japanese Patent Laid-Open No. 2002-217116, the recess for forming the space that blocks propagation of the threading dislocation is formed by using the threading dislocation. If a threading dislocation should occur after etching, it occurs in a portion where no space is present, and accordingly propagation of the threading dislocation is not blocked by a space. To prevent occurrence of a threading dislocation after etching, the hetero epitaxial growth film must be completely relaxed before performing the etching. This complete relax is indispensable in commercialization. To completely relax the stress, a sufficiently thick hetero epitaxial growth film must be deposited before performing the etching.

More specifically, with the techniques described in U.S. Pat. No. 6,503,773 and Japanese Patent Laid-Open No. 2002-217116, to sufficiently relax the stress in the hetero epitaxial growth layer, the hetero epitaxial growth layer must be sufficiently thick. This limits the throughput and increases the manufacturing cost.

SUMMARY OF THE INVENTION

The present invention has been made based on the recognition of the above problems, and has as its object to decrease limitations on the film thickness which are required to make compatible both relax of the stress in the hetero epitaxial growth film and suppression of the density of crystal defects of the hetero epitaxial growth film threading to a surface and generated to accompany the relax, so that the degrees of freedom in process design are increased.

A method of manufacturing a semiconductor substrate according to the present invention comprises a growing step of growing a second single crystalline semiconductor on a first single crystalline semiconductor, a blocking layer forming step of forming a blocking layer on the second single crystalline semiconductor, and a relaxing step of generating crystal defects at a portion deeper than the blocking layer, after the blocking layer is formed, to relax a stress acting on the second single crystalline semiconductor. The blocking layer prevents the crystal defects at the portion deeper than the blocking layer from propagating to a surface of the second single crystalline semiconductor.

According to a preferred embodiment of the present invention, the blocking layer forming step can include a step of forming a porous layer as the blocking layer in the second single crystalline semiconductor. In the blocking layer forming step, for example, the porous layer can be formed by anodizing, stain etching, or ion implantation.

According to another preferred embodiment of the present invention, in the blocking layer forming step, for example, the porous layer can be formed by ion implantation.

According to still another preferred embodiment of the present invention, in the blocking layer forming step, the porous layer can be formed while the stress acts on the second single crystalline semiconductor.

According to still another preferred embodiment of the present invention, the first and second single crystalline semiconductors typically have different lattice constants and/or thermal expansion coefficients.

According to still another preferred embodiment of the present invention, the manufacturing method can further comprise a step of forming a third single crystalline semiconductor on the second single crystalline semiconductor.

According to still another preferred embodiment of the present invention, for example, the relaxing step can include an annealing step. The annealing step is preferably performed at a temperature higher than a temperature in the growing step. Alternatively, the relaxing step may include a step of increasing/decreasing a temperature.

According to still another preferred embodiment of the present invention, the relaxing step may include a step of forming a third single crystalline semiconductor on the second single crystalline semiconductor. In this case, formation of the third single crystalline semiconductor relaxes the stress acting on the second single crystalline semiconductor. The first and third single crystalline semiconductors typically have different lattice constants and/or thermal expansion coefficients.

According to still another preferred embodiment of the present invention, in the blocking layer forming step, a porous layer is preferably formed on a surface of the second single crystalline semiconductor, and the third single crystalline semiconductor is preferably formed after pores in a surface of the porous layer are sealed.

According to still another preferred embodiment of the present invention, for example, the relaxing step can include a step of applying a physical force to the second single crystalline semiconductor.

According to still another preferred embodiment of the present invention, the first single crystalline semiconductor can contain silicon, and the second single crystalline semiconductor can contain silicon and germanium.

According to still another preferred embodiment of the present invention, the first single crystalline semiconductor can contain silicon, and the second and third single crystalline semiconductors can contain silicon and germanium.

According to still another preferred embodiment of the present invention, the manufacturing method can further comprise a step of forming a fourth single crystalline semiconductor having a strain on the third single crystalline semiconductor.

A semiconductor substrate according to the present invention comprises a first single crystalline semiconductor, a second single crystalline semiconductor formed on the first single crystalline semiconductor, and a blocking layer formed on the second single crystalline semiconductor, wherein crystal defects which are present at a portion deeper than the blocking layer relax a stress acting on the second single crystalline semiconductor, and the blocking layer includes a portion that terminates the crystal defects and a portion that does not terminate the crystal defects.

According to still another preferred embodiment of the present invention, the semiconductor substrate preferably further comprises a third single crystalline semiconductor formed on the blocking layer.

According to the present invention, for example, limitations on the film thickness are decreased which are required to make compatible both relax of the stress in the hetero epitaxial growth film and suppression of the density of crystal defects threading to a surface of the hetero epitaxial growth film and generated to accompany the relax, so that the degrees of freedom in process design are increased.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 1 is a table showing examples of hetero epitaxial growth;

FIG. 4 is a table showing preferable combination examples of the materials of the first, second, and third single crystalline semiconductors;

DETAILED DESCRIPTION OF THE PREFERRED EMBODIMENTS

The preferred embodiments of the present invention will be described with reference to the accompanying drawings.

FIGS. 2A to 2E are schematic sectional views showing a method of manufacturing a semiconductor substrate according to a preferred embodiment of the present invention. According to this manufacturing method, first, in the growing step shown in FIG. 2A, a second single crystalline semiconductor (e.g., SiGe) 12 is epitaxially grown on a first single crystalline semiconductor (e.g., a single crystalline silicon substrate) 10. The first and second single crystalline semiconductors 10 and 12 have different lattice constants and/or thermal expansion coefficients, and accordingly a stress acts on the second single crystalline semiconductor 12. For example, if the first single crystalline semiconductor 10 is Si and second single crystalline semiconductor 12 is SiGe, a compressive stress acts on the second single crystalline semiconductor 12.

The thickness of the second single crystalline semiconductor 12 is so determined that the density of lattice defects that can occur in the surface of the second single crystalline semiconductor 12 falls within an allowable range. For example, when the second single crystalline semiconductor 12 has a critical film thickness or less, no lattice defects resulting from by hetero epitaxial growth occur in the second single crystalline semiconductor 12, and if any, they are negligible.

Figure 2A:
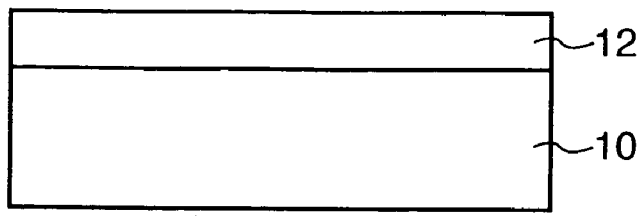
FIGS. 2A to 2E are schematic sectional views showing a method of manufacturing a semiconductor substrate according to a preferred embodiment of the present invention.
Figure 2B:
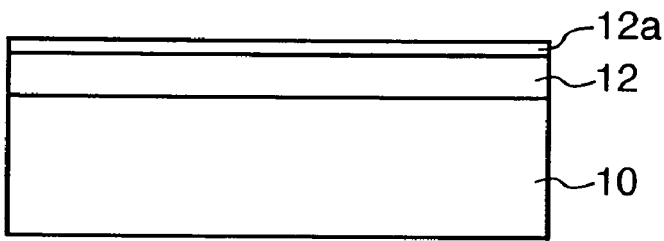

In the blocking layer forming step shown in FIG. 2B, a blocking layer 12a is formed on the surface or at a desired depth position of the second single crystalline semiconductor 12. The blocking layer 12a is formed such that it can prevent crystal defects, which can be generated in a portion deeper than the blocking layer 12a, typically in the interface and in its vicinity of the first and second single crystalline semiconductors 10 and 12 and between the first single crystalline semiconductor 10 and blocking layer 12a, from propagating to the surface of the second single crystalline semiconductor 12. Typically, the blocking layer 12a can be formed as a porous layer. The porous layer is a layer that includes many pores, and can be formed by, e.g., anodizing, stain etching, or ion implantation. With anodizing or stain etching, the porous layer is formed on the surface of the second single crystalline semiconductor 12. With ion implantation, the porous layer can be formed at an arbitrary depth in the second single crystalline semiconductor 12.

Figure 2C:
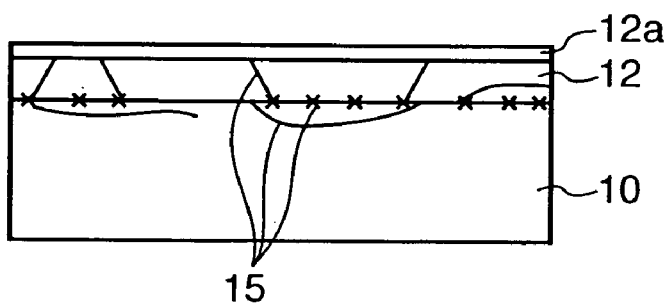

In the relaxing step shown in FIG. 2C, crystal defects 15 are generated at a portion deeper than the blocking layer 12a, typically in the interface of the first and second single crystalline semiconductors 10 and 12, in the vicinity of the interface, and between the first single crystalline semiconductor 10 and blocking layer 12a, to relax the stress acting on the second single crystalline semiconductor 12. As the crystal defects 15 occur where the stress is concentrated, they do not occur on the upper surface side of the blocking layer 12a, but at a portion deeper than the blocking layer 12a, particularly in the interface of the first and second single crystalline semiconductors 10 and 12 and in the vicinity of the interface, as the start point. Accordingly, no special means is necessary to limit the position where the crystal defects 15 occur to a portion deeper than the blocking layer 12a. When the stress is relaxed completely (that is, when the stress is relaxed 100%), the second single crystalline semiconductor 12 has its original lattice constant.

The crystal defects 15 can include dislocations (e.g., misfit dislocations) and/or stacking faults. When the crystal defects 15 extend one- or two-dimensionally toward the blocking layer 12a, they are blocked by the blocking layer 12a. Typically, the blocking layer 12a is formed of a porous layer. The crystal defects 15 extending one- or two-dimensionally are terminated by pores which form the porous layer, so that their propagation is blocked. The stress is relaxed in the porous layer. Thus, a crystal defect seldomly occurs in the porous layer, and if any, it is terminated by the pores which form the porous layer.

As described above, after the blocking layer 12a is formed in the second single crystalline semiconductor 12, the relaxing step is performed to block propagation of crystal defects occurring in the relaxing step. Thus, the crystal defects can be prevented from piercing through the surface of the second single crystalline semiconductor 12. Hence, in the subsequent second growing step (FIG. 2D), the high-quality third single crystalline semiconductor can be formed on the underlying second single crystalline semiconductor 12. As the stress in the underlying second single crystalline semiconductor 12 is sufficiently relaxed, an excessive stress does not act on the third single crystalline semiconductor.

Crystal defects can be caused by various types of methods. For example, crystal defects can be caused by (A) annealing the substrate, (B) increasing and decreasing (repeating annealing and cooling (at least once)) the temperature of the substrate, and (C) growing the third single crystalline semiconductor on the substrate to exceed the critical film thickness, or by employing both (A) and (C), or both (B) and (C). It is also possible to apply an external physical force to the substrate (second single crystalline semiconductor 12) to cause crystal defects, thus relaxing the stress.

In the method of annealing the substrate, preferably, the substrate is annealed to a temperature higher than in the epitaxial growing step (FIG. 2A). This can effectively relax the stress. The larger the difference between the temperature in the epitaxial growing step and the annealing temperature in the relaxing step, the more advantageous it is in relaxing the stress. In this respect, the epitaxial growing step is preferably performed at a low temperature.

In the method of increasing and decreasing (repeating annealing and cooling (at least one)) the temperature of the substrate, the difference in thermal expansion coefficient between the first and second single crystalline semiconductors 10 and 12 is utilized to cause a continuous strain change in the process of increasing and decreasing the temperature, thus causing crystal defects. If annealing undesirably causes a structural change in the pores of the porous layer, the pressure during annealing is preferably set to be higher than the pressure in the epitaxial growing step (FIG. 2A). This can suppress the structural change. A structural change of the porous material can also be suppressed by annealing in an inert atmosphere such as Ar.

Furthermore, the relaxing step is preferably performed after the porous layer as the blocking layer 12a is formed on the surface of the second single crystalline semiconductor 12 and before the pores in the surface of the porous layer are sealed. In this case, the stress in the porous layer serving as the blocking layer 12a is relaxed simultaneously with the stress in the second single crystalline semiconductor 12. Thus, the pores in the porous layer can be sealed by using the same material as that of the second single crystalline semiconductor 12 in a stress-free state or a state with a small stress. Consequently, a smooth surface layer having very few crystal defects can be obtained, and a high-quality third single crystalline layer can be formed on the surface layer.

The method of growing the third single crystalline semiconductor on the substrate to exceed the critical film thickness is particularly useful when a third single crystalline semiconductor which exceeds the critical film thickness is required.

Figure 2D:
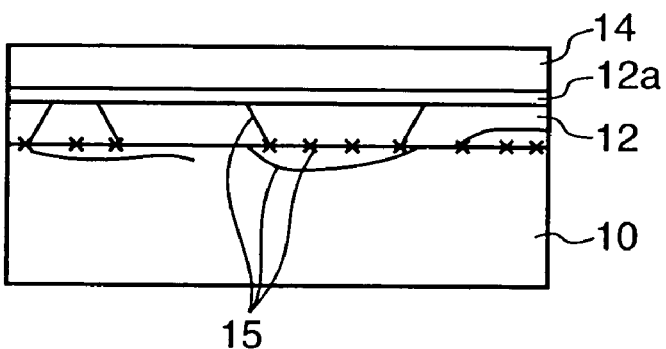

In the second growing step shown in FIG. 2D, a third single crystalline semiconductor (e.g., GaAs) 14 is epitaxially grown on the second single crystalline semiconductor 12 (or on the blocking layer 12a on the second single crystalline semiconductor 12 when the blocking layer 12a is formed on the surface of the second single crystalline semiconductor 12). Typically, the third single crystalline semiconductor 14 can be formed of a material (typically, a material having the same composition as that of the second single crystalline semiconductor 12) which has almost the same lattice constant and/or thermal expansion coefficient as that of the second single crystalline semiconductor 12. If the third single crystalline semiconductor 14 is to be formed on the second single crystalline semiconductor 12 without relaxing the second single crystalline semiconductor 12 completely, the third single crystalline semiconductor 14 is formed of a material having a lattice constant which substantially coincides with the lattice constant (apparent lattice constant) of the second single crystalline semiconductor 12 which is relaxed incompletely.

As described above, as the stress in the underlying second single crystalline semiconductor 12 is relaxed sufficiently, no stress occurs in the third single crystalline semiconductor 14, or if any, only a sufficiently small stress occurs in the third single crystalline semiconductor 14. Therefore, the third single crystalline semiconductor 14 forms a high-quality film with very few crystal defects. With the above steps, a semiconductor substrate can be obtained which has on its surface the single crystalline semiconductor 14 in which the stress is sufficiently relaxed and crystal defects are very few.

When a porous layer is to be formed as the blocking layer 12a on the surface of the second single crystalline semiconductor 12, a step of sealing the pores in the surface of the porous layer is preferably performed before performing the second growing step.

Figure 3:
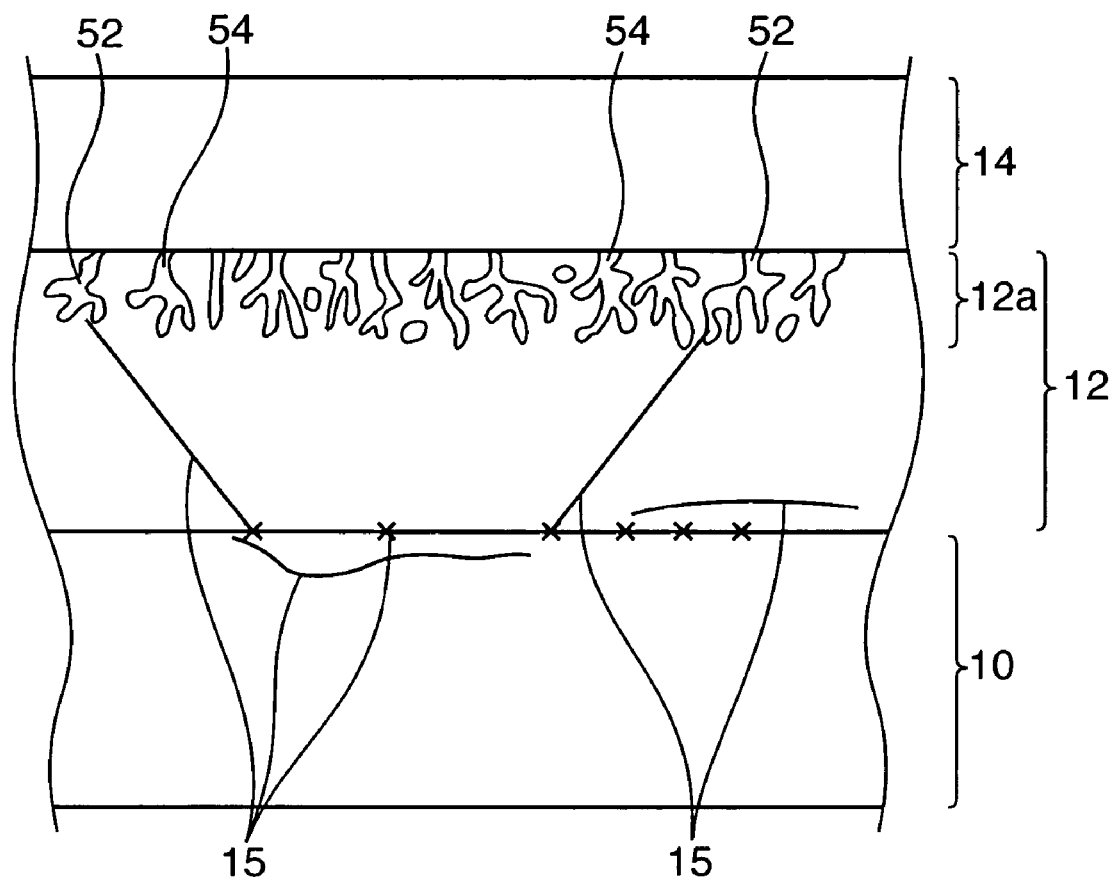
FIG. 3 is a sectional view schematically showing the structure of a semiconductor substrate which is formed with the steps shown in FIGS. 2A to 2C.

FIG. 3 is a sectional view schematically showing the structure of the semiconductor substrate which is formed with the steps shown in FIGS. 2A to 2C. According to this embodiment, the blocking layer 12a is formed on the upper surface side of the substrate than a portion where crystal defects can occur (in the interface of the first and second single crystalline semiconductors 10 and 12, in the vicinity of the interface, and within the second single crystalline semiconductor 12) to cover this portion before the crystal defects 15 are introduced into the second single crystalline semiconductor 12 for relaxing the stress, that is, regardless of the crystal defects 15 that can occur. Therefore, the blocking layer 12a can include terminating portions 52 (holes in the case of a porous layer) which terminate the crystal defects 15 introduced in the relaxing step after formation of the blocking layer 12a, and non-terminating portions 54 (pores in the case of a porous layer) which do not terminate the crystal defects. When crystal defects occur afterwards, even the portions 54 which do not terminate the crystal defect serve to terminate the crystal defects. According to the technique described in Japanese Patent Laid-Open No. 2002-217116, the space for blocking propagation of the defects is formed by etching using a threading dislocation. Thus, all spaces terminate threading dislocations, and a space that does not terminate a threading dislocation cannot exist.

Figure 2E:
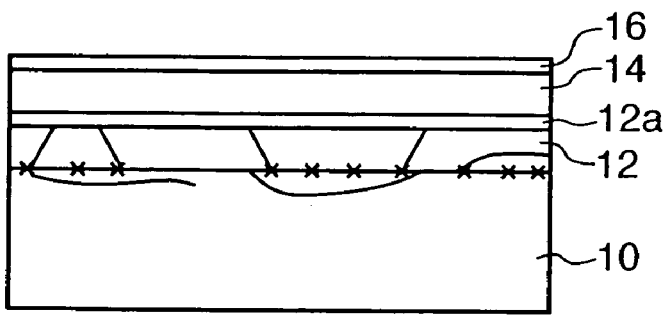

Subsequent to the second growing step shown in FIG. 2D, the third growing step can be performed as shown in FIG. 2E. In the third growing step, a fourth single crystalline semiconductor (e.g., Si) 16 is epitaxially grown on the third single crystalline semiconductor 14. If the fourth single crystalline semiconductor 16 is formed of a material the lattice constant of which is different from that of the third single crystalline semiconductor 14, a stress acts on the fourth single crystalline semiconductor 16, so that the resultant fourth single crystalline semiconductor 16 is used as a strained semiconductor.

The structure and forming method of the blocking layer 12a which is formed in the blocking layer forming step shown in FIG. 2B can be determined by considering various types of factors, i.e., the thicknesses and materials of the first, second, and third single crystalline semiconductors 10, 12, and 14, and a defect density that can be allowed in the third single crystalline semiconductor 14. For example, when a porous layer is formed as the blocking layer 12a, usually, the blocking rate of propagation of the crystal defects can be increased by increasing the density of pores, porosity, and thickness of the porous layer.

The porous layer can be formed by, e.g., anodizing, stain etching, or ion implantation, as described above.

In the method of forming a porous layer by anodizing, for example, when the surface of a substrate having Si or SiGe on its surface is to be anodized, the substrate surface may be set as the anode and a current may be supplied between the substrate surface and the cathode through a HF-containing solution to make the substrate surface porous. An example of a material that can be anodized can include SiC, GaAs, GaN, InP, GaP, CdTe, and ZnTe.

As a method of forming a porous layer by stain etching, a method of dipping a substrate having Si or SiGe in its surface in a solution containing HF and nitric acid is available. Regarding a substrate having Si, for example, the substrate may be dipped for several sec to several ten sec in a room-temperature solution mixture containing 49% HF, 70% nitric acid, and water at a volume ratio of 1:3:5, to form a porous layer. Regarding a substrate having SiGe, for example, a solution mixture containing 49% HF, 70% nitric acid, and water at a volume ratio of 4:1:4 can be used. As a method of forming a porous layer by ion implantation, a method of implanting hydrogen or helium ions in the substrate is suitable.

The first, second, and third single crystalline semiconductors 10, 12, and 14 can be formed of different materials. Typically, the second single crystalline semiconductor 12 can be formed of the same material as that of the third single crystalline semiconductor 14. FIG. 4 shows preferable combination examples of the materials of the first, second, and third single crystalline semiconductors 10, 12, and 14. It is known that the single crystalline semiconductors which are indicated in FIG. 4 as the materials of the second and third single crystalline semiconductors 12 and 14 can be made porous by anodizing (Electrochemistry of Nanomaterials, Edited by Gary Hodes).

According to this embodiment, the relaxing step is performed after forming the blocking layer 12a on the second single crystalline semiconductor 12, so that propagation of the crystal defects occurring in the relaxing step is blocked by the blocking layer 12a. The crystal defects can thus be prevented from piercing through the surface of the second single crystalline semiconductor 12. Therefore, in the second growing step which is performed subsequent to the relaxing step, the high-quality third single crystalline semiconductor 14 can be formed on the underlying second single crystalline semiconductor 12. As the stress in the underlying second single crystalline semiconductor 12 is sufficiently relaxed, no excessing stress acts on the third single crystalline semiconductor 14.

According to this embodiment, to relax the stress acting on the second single crystalline semiconductor 12, the second single crystalline semiconductor 12 need not be grown to exceed the critical film thickness. This increases the degrees of freedom in process design. With each of the techniques described in U.S. Pat. No. 6,503,773 and Japanese Patent Laid-Open No. 2002-217116, the epitaxial growth film must be sufficiently thick. This leads to a low degree of freedom in process design.

According to this embodiment, the blocking layer blocks propagation of defects, which occur after formation of the blocking layer, to the substrate surface. Therefore, for example, even a defect which occurs after the substrate is completed (e.g., during a device process) can also be blocked. With the technique described in Japanese Patent Laid-Open No. 2002-217116, assume that the stress in the epitaxial growth film is not sufficiently relaxed in the epitaxial growing step before etching. Regarding a defect that can occur to accompany stress relax after etching, its propagation cannot be blocked because a space (which is formed by etching) that blocks the propagation does not exist.

EXAMPLES

Example 1

Figure 5:
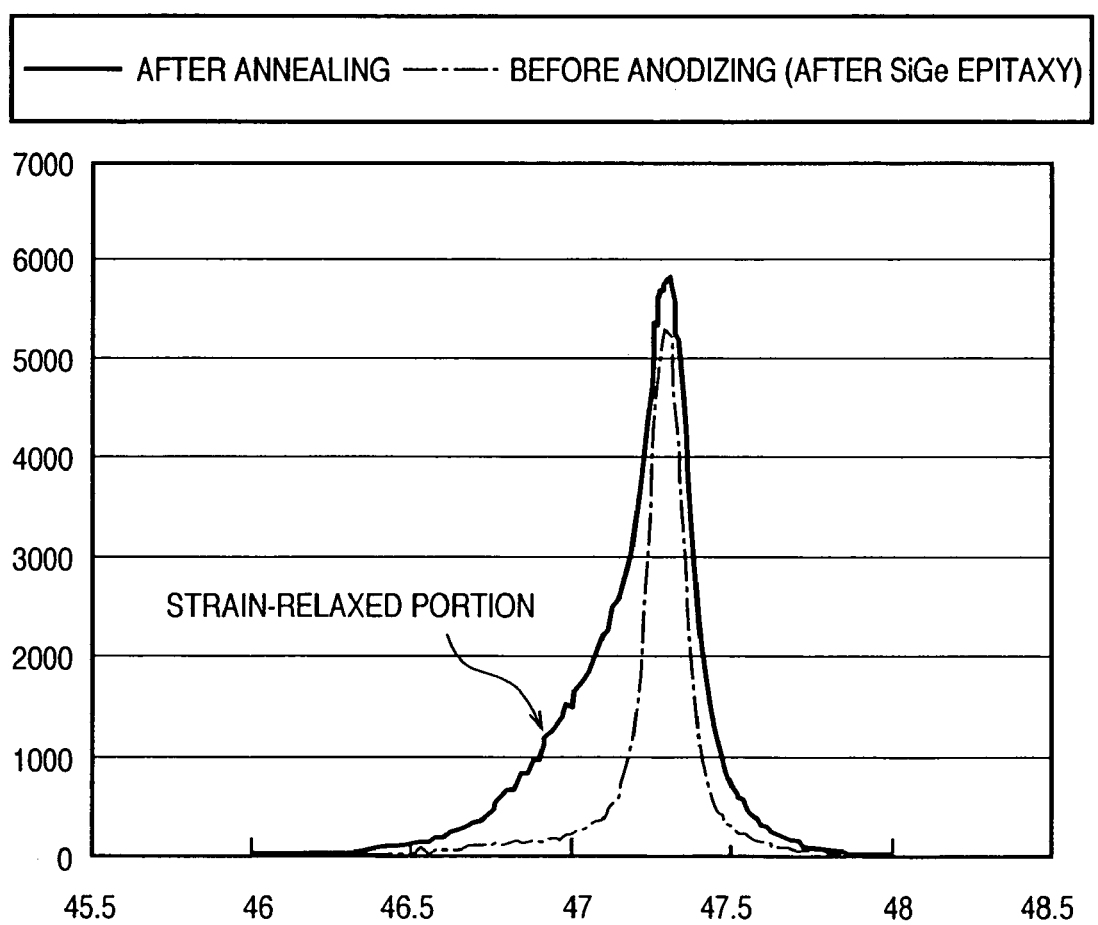
FIG. 5 is a graph showing a compressive stress in a SiGe layer and how it is relaxed.

First, a first SiGe layer 12 containing 20 at % of Ge was epitaxially grown on a single crystalline Si substrate 10 for 100 nm (FIG. 2A). At this time point, it was confirmed by Raman scattering and in-plane XRD that the SiGe layer 12 received a compressive stress (FIG. 5).

Subsequently, that region of the SiGe layer 12 which was in the vicinity of the surface was made porous by anodizing to form a porous layer serving as a blocking layer 12a (FIG. 2B). In the anodizing step, a current of 1 mA/cm$^2$ was supplied to the substrate for 30 sec in a liquid mixture containing 42.5% of HF, 9.2% of IPA, and water. It was confirmed by sectional TEM that the substrate became porous in a region from the surface to the depth of 30 nm.

Subsequently, the substrate was annealed at 750° C. for 2 sec to introduce misfit dislocations (crystal defects) to a portion deeper than the blocking layer 12a in order to relax the strain (stress) of the SiGe layer 12 (FIG. 2C). Relax of the strain was confirmed by in-plane XRD (FIG. 5). When sectional TEM observation was performed, many misfit dislocations occurred in the interface of the first SiGe layer 12 and single crystalline Si substrate 10 and in the vicinity of the interface. Although a threading dislocation extending from a misfit dislocation toward the surface of the substrate was observed, it had been blocked by the porous SiGe layer 12a.

Subsequently, a second SiGe layer 14 containing 20 at % of Ge was epitaxially grown on the porous SiGe layer 12a (FIG. 2D). With the above steps, a substrate having a strain-free (i.e., stress-relaxes), defect-free SiGe layer on the single crystalline Si substrate 10 was obtained.

Example 2

First, a first SiGe layer 12 containing 30 at % of Ge was epitaxially grown on a single crystalline Si substrate 10 for 100 nm (FIG. 2A). At this time point, the SiGe layer 12 receives a compressive stress.

Subsequently, that region of the SiGe layer 12 which was in the vicinity of the surface was made porous by anodizing to form a porous layer serving as a blocking layer 12a (FIG. 2B). In the anodizing step, a current of 1 mA/cm$^2$ was supplied for 30 sec in a liquid mixture containing 42.5% of HF, 9.2% of IPA, and water. This made the substrate porous in a region from the surface to the depth of 30 nm.

Subsequently, the substrate was annealed at 700° C. for 2 sec to introduce misfit dislocations to a portion deeper than the blocking layer 12a in order to relax the strain (stress) of the SiGe layer 12 (FIG. 2C). According to this example, 100% relax of the strain is not needed. According to the Vegard's law, the lattice constant of SiGe containing 30 at % of Ge is 5.49 Å. Therefore, by only relaxing 60% of the strain of the SiGe layer 12 which is defined by the lattice constant of 5.13 Å of the single crystalline Si substrate 10 immediately after the epitaxial growth, the lattice constant of the SiGe layer 12 becomes 5.47 Å which is the lattice constant of SiGe with a Ge concentration of 20% that should be grown on the SiGe layer 12. Therefore, according to this example, annealing for introducing misfit dislocations (i.e., relax) can be decreased, so that the productivity improves.

Subsequently, a second SiGe layer 14 containing 20 at % of Ge was epitaxially grown on the incompletely relaxed SiGe layer 12 (FIG. 2D).

Example 3

First, a first SiGe layer 12 containing 20 at % of Ge was epitaxially grown on a single crystalline Si substrate 10 for 100 nm (FIG. 2A). Subsequently, that region of the SiGe layer 12 which was in the vicinity of the surface was made porous by anodizing to form a porous layer serving as a blocking layer 12a (FIG. 2B). In the anodizing step, a current of 1 mA/cm$^2$ was supplied to the substrate for 30 sec in a liquid mixture containing 42.5% of HF, 9.2% of IPA, and water. It was confirmed by FE-SEM that the substrate became porous in a region from the surface to the depth of 30 nm.

Subsequently, a second SiGe layer 14 containing 20 at % of Ge was epitaxially grown for 2 μm (FIGS. 2C and 2D). As the thickness of the SiGe layer 14 increased, misfit dislocations were introduced. The misfit dislocations occurred in the interface of the single crystalline Si substrate 10 and first SiGe layer 12 and in the vicinity of the interface. A threading dislocation was blocked by the porous SiGe layer 12a and did not reach the second SiGe layer 14.

Example 4

First, a first SiGe layer 12 containing 20 at % of Ge was epitaxially grown on a single crystalline Si substrate 10 for 100 nm (FIG. 2A). At this time point, it was confirmed by Raman scattering and in-plane XRD that the SiGe layer 12 received a compressive stress (FIG. 5).

Subsequently, that region of the SiGe layer 12 which was in the vicinity of the surface was made porous by anodizing to form a porous layer serving as a blocking layer 12a (FIG. 2B). In the anodizing step, a current of 1 mA/cm$^2$ was supplied to the substrate for 30 sec in a liquid mixture containing 42.5% of HF, 9.2% of IPA, and water. It was confirmed by sectional TEM that the substrate became porous in a region from the surface to the depth of 30 nm.

Subsequently, the substrate was annealed at 750° C. for 2 sec to introduce misfit dislocations (crystal defects) to a portion deeper than the blocking layer 12a in order to relax the strain (stress) of the SiGe layer 12 (FIG. 2C). Relax of the strain was confirmed by in-plane XRD (FIG. 5).

Subsequently, a 2 μm-thick SiGe layer 14 (containing 20% of Ge) was epitaxially grown (FIG. 2D). When sectional TEM observation was performed, many misfit dislocations occurred in the interface of the first SiGe layer 12 and single crystalline Si substrate 10 and in the vicinity of the interface. Although a threading dislocation extending from a misfit dislocation toward the surface of the substrate was observed, it had been blocked by the porous SiGe layer 12a. With the above steps, a substrate having a strain-free (i.e., stress-relaxes), defect-free SiGe layer on the Si substrate 10 was obtained.

Example 5

First, a first SiGe layer 12 containing 30 at % of Ge was epitaxially grown on a single crystalline Si substrate 10 for 120 nm at 550° C. (FIG. 2A). At this time point, it was confirmed by Raman scattering and in-plane XRD that the SiGe layer 12 received a compressive stress.

Subsequently, that region of the SiGe layer 12 which was in the vicinity of the surface was made porous by anodizing to form a porous layer serving as a blocking layer 12a (FIG. 2B). In the anodizing step, a current of 1 mA/cm$^2$ was supplied to the substrate for 80 sec in a liquid mixture containing 42.5% of HF, 9.2% of IPA, and water. It was confirmed by sectional TEM that the substrate became porous in a region from the surface to the depth of 80 nm.

Subsequently, the substrate was annealed at 1,000° C. for 2 sec in an Ar atmosphere to introduce misfit dislocations (crystal defects) to a portion deeper than the blocking layer 12a in order to relax the strain (stress) of the SiGe layer 12 (FIG. 2C). Annealing in an inert atmosphere such as Ar can suppress the structural change of the porous material which forms the blocking layer. Relax of the strain was confirmed by in-plane XRD. When sectional TEM observation was performed, many misfit dislocations occurred in the interface of the first SiGe layer 12 and Si substrate 10 and in the vicinity of the interface. Although a threading dislocation extending from a misfit dislocation toward the surface of the substrate was confirmed, it had been blocked by the porous SiGe layer 12a.

Subsequently, a second SiGe layer 14 containing 20 at % of Ge was epitaxially grown on the porous SiGe layer 12a at a temperature of 620° C. (FIG. 2D). In this case, first, the pores in the surface of the porous SiGe layer 12a were filled at a low growing rate (0.5 nm/min to 1 nm/min). Then, an epitaxial layer was formed at a high growing rate (20 nm/min to 50 nm/min). When the defect density of the epitaxial layer was checked by Secco etching, the density of threading dislocations was about $4 \times 10^3/cm^2$. With the above steps, a substrate having a strain-free (i.e., stress-relaxed) SiGe layer with a few defects on the Si substrate 10 was obtained.

Example 6

First, a first SiGe layer 12 containing 30 at % of Ge was epitaxially grown on a single crystalline Si substrate 10 for 120 nm at 550° C. (FIG. 2A). At this time point, it was confirmed by Raman scattering and in-plane XRD that the lattice of the SiGe layer 12 was similar to that of the Si substrate 10 and that the SiGe layer 12 received a compressive stress.

Subsequently, that region of the SiGe layer 12 which was in the vicinity of the surface was made porous by anodizing to form a porous layer serving as a blocking layer 12a (FIG. 2B). In the anodizing step, a current of 1 mA/cm² was supplied to the substrate for 90 sec in a liquid mixture containing 42.5% of HF, 9.2% of IPA, and water. It was confirmed by sectional TEM that the substrate became porous in a region from the surface to the depth of 90 nm.

Figure 6:
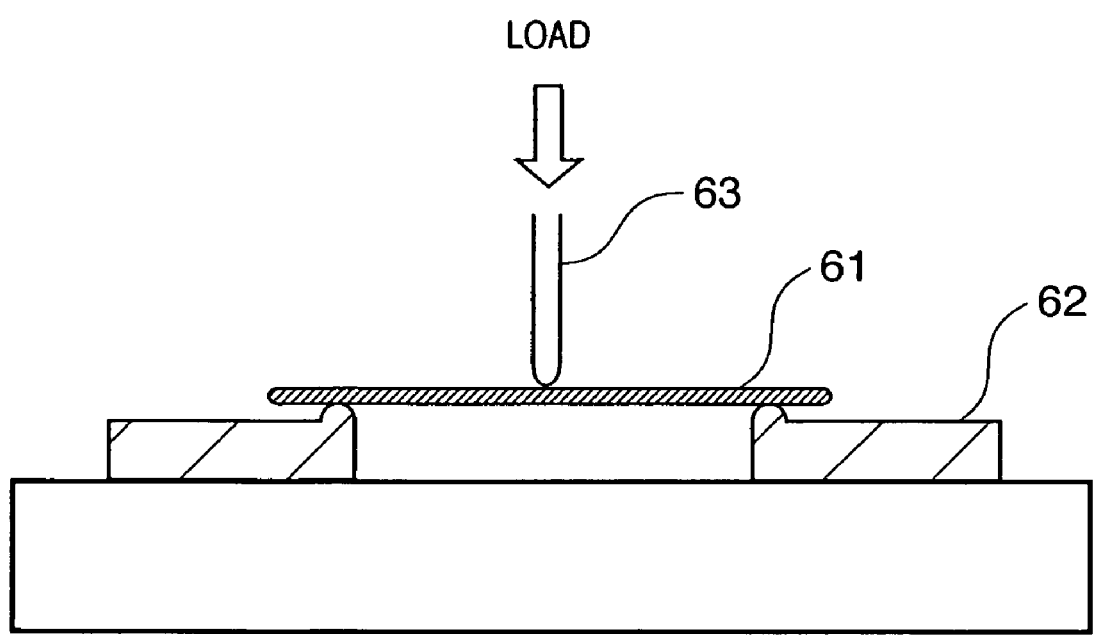
FIG. 6 is a view showing a jig that relaxes the SiGe layer.

A substrate 61 obtained in this manner was held by a holding portion 62 of a jig exemplified in FIG. 6. A load of 3 kgf was applied with pin contact by a pin 63 to the center of the substrate 61 from the lower surface side to warp the entire substrate 61 such that the upper surface side became convex downward. This introduced misfit dislocations (crystal defects) to a portion deeper than the blocking layer 12a to relax the strain (stress) of the SiGe layer 12 (FIG. 2C). Relax of the strain was confirmed by in-plane XRD. When sectional TEM observation was performed, many misfit dislocations occurred in the interface of the first SiGe layer 12 and Si substrate 10 and in the vicinity of the interface. Although a threading dislocation extending from a misfit dislocation toward the surface of the substrate was confirmed, it had been blocked by the porous SiGe layer 12a.

Subsequently, a second SiGe layer 14 containing 20 at % of Ge was epitaxially grown on the relaxed porous SiGe layer 12a (FIG. 2D). When the defect density of the epitaxial layer was checked by Secco etching, the density of threading dislocations was about $2 \times 10^3/cm^2$. With the above steps, a substrate having a strain-relaxed SiGe layer with a few defects on the Si substrate 10 was obtained.

Example 7

First, a first SiGe layer 12 containing 35 at % of Ge was epitaxially grown on a single crystalline Si substrate 10 for 100 nm at 550° C. (FIG. 2A). At this time point, the lattice of the SiGe layer 12 is similar to that of the Si substrate 10, and the SiGe layer 12 receives a compressive stress.

Subsequently, that region of the SiGe layer 12 which was in the vicinity of the surface was made porous by anodizing to form a porous layer serving as a blocking layer 12a (FIG. 2B). In the anodizing step, a current of 1 mA/cm² was supplied for 60 sec in a liquid mixture containing 42.5% of HF, 9.2% of IPA, and water. This made the substrate porous in a region from the surface to the depth of 60 nm.

Figure 7:
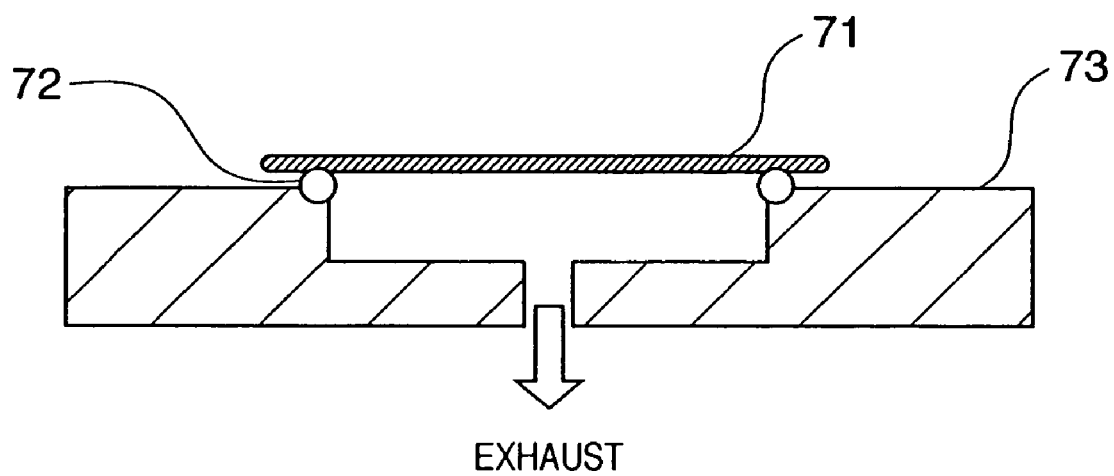
FIG. 7 is a view showing another jig that relaxes the SiGe layer.

A substrate 71 obtained in this manner was held by a holding portion 73 of a jig exemplified in FIG. 7 through an O-ring (seal member) 72. The lower surface side of the substrate (upper side in FIG. 7) was left in an atmospheric pressure while the upper surface side of the substrate (lower side in FIG. 7) was reduced in pressure, so that the substrate 71 deformed (such that its upper surface side became convex downward). This introduced misfit dislocations to a portion deeper than the blocking layer 12a to relax the strain (stress) of the SiGe layer 12 (FIG. 2C). Relax of the strain was confirmed by in-plane XRD. After the relax, a lattice constant a of the SiGe layer 12 was 0.5477 nm, and that of SiGe layer having a Ge concentration of 30% was 0.5493 nm. Accordingly, the lattice mismatch was about 0.05%. When sectional TEM observation was performed, many misfit dislocations occurred in the interface of the first SiGe layer 12 and Si substrate 10 and in the vicinity of the interface. Although a threading dislocation extending from a misfit dislocation toward the surface of the substrate was confirmed, it had been blocked by the porous SiGe layer 12a. According to this example, the strain is relaxed easily within a short period of time, so that the productivity improves.

Subsequently, a second SiGe layer 14 containing 30 at % of Ge was epitaxially grown on the SiGe layer 12 at a temperature of 620° C. (FIG. 2D). In this case, first, the pores in the surface of the porous SiGe layer 12a were filled at a low growing rate (0.5 nm/min to 1 nm/min). Then, the epitaxial layer was formed at a high growing rate (20 nm/min to 50 nm/min). When the defect density of the epitaxial layer was checked by Secco etching, the density of threading dislocations was about $1 \times 10^3/cm^2$.

Example 8

First, a first SiGe layer 12 containing 30 at % of Ge was epitaxially grown on a single crystalline Si substrate 10 for 120 nm at 550° C. (FIG. 2A). At this time point, it was confirmed by Raman scattering and in-plane XRD that the lattice of the SiGe layer 12 was similar to that of the Si substrate 10 and that the SiGe layer 12 received a compressive stress. Subsequently, that region of the SiGe layer 12 which was in the vicinity of the surface was made porous by anodizing to form a porous layer serving as a blocking layer 12a (FIG. 2B). In the anodizing step, a current of 1 mA/cm² was supplied to the substrate for 90 sec in a liquid mixture containing 42.5% of HF, 9.2% of IPA, and water. It was confirmed by FE-SEM that this made the substrate porous in a region from the surface to the depth of 90 nm.

A substrate obtained in this manner was placed in a tank where an ultrasonic vibrator was disposed. An ultrasonic energy was applied to the substrate to introduce misfit dislocations (crystal defects) to a portion deeper than the blocking layer 12a in order to relax the strain (stress) of the SiGe layer 12 (FIG. 2C). Relax of the strain was confirmed by in-plane XRD. When sectional TEM observation was performed, many misfit dislocations occurred in the interface of the first SiGe layer 12 and Si substrate 10 and in the vicinity of the interface. Although a threading dislocation extending from a misfit dislocation toward the surface of the substrate was confirmed, it had been blocked by the porous SiGe layer 12a.

Subsequently, a second SiGe layer 14 containing 20 at % of Ge was epitaxially grown (FIG. 2D). When the defect density of the epitaxial growth was checked by Secco etching, the density of the threading dislocations was about $6 \times 10^3/cm^2$.

As many apparently widely different embodiments of the present invention can be made without departing from the spirit and scope thereof, it is to be understood that the invention is not limited to the specific embodiments thereof except as defined in the claims.

CLAIM OF PRIORITY

This application claims priorities from Japanese Patent Application Nos. 2004-234353 and 2005-123984 filed on Aug. 11, 2004 and Apr. 21, 2005, respectively the entire contents of which are hereby incorporated by reference herein.

What is claimed is:

1. A method of manufacturing a semiconductor substrate, the method comprising:
   a growing step of growing a second single crystalline semiconductor on a first single crystalline semiconductor;
   a blocking layer forming step of forming a porous layer as a blocking layer in a surface of the second single crystalline semiconductor;
   a relaxing step of generating crystal defects at a portion deeper than the blocking layer, after the blocking layer is formed, to relax a stress acting on the second single crystalline semiconductor; and
   a second growing step of growing a third single crystalline semiconductor on the second single crystalline semiconductor, the second growing step including sealing a surface of the porous layer, after the relaxing step, by epitaxially growing the third single crystalline semiconductor on the second single crystalline semiconductor,
   wherein the blocking layer prevents the crystal defects at the portion deeper than the blocking layer from propagating to a surface of the second single crystalline semiconductor,
   wherein the relaxing step includes a step of repeating increasing and decreasing a temperature a plurality of times.

2. The method according to claim 1, wherein in the blocking layer forming step, the porous layer is formed by anodizing.

3. The method according to claim 1, wherein in the blocking layer forming step, the porous layer is formed by stain etching.

4. The method according to claim 1, wherein in the blocking layer forming step, the porous layer is formed by ion implantation.

5. The method according to claim 1, wherein in the blocking layer forming step, the blocking layer is formed by ion implantation.

6. The method according to claim 1, wherein in the blocking layer forming step, the blocking layer is formed while the stress acts on the second single crystalline semiconductor.

7. The method according to claim 1, wherein the first and second single crystalline semiconductors have different lattice constants and/or thermal expansion coefficients.

8. The method according to claim 1, wherein the relaxing step further includes an annealing step.

9. The method according to claim 8, wherein the annealing step is performed at a temperature higher than a temperature in the growing step.

10. The method according to claim 1, wherein the first and third single crystalline semiconductors have different lattice constants and/or thermal expansion coefficients.

11. The method according to claim 1, wherein the relaxing step further includes a step of applying a physical force to the second single crystalline semiconductor.

12. The method according to claim 1, wherein the first single crystalline semiconductor contains silicon, and the second single crystalline semiconductor contains silicon and germanium.

13. The method according to claim 1, wherein the first single crystalline semiconductor contains silicon, and the second and third single crystalline semiconductors contain silicon and germanium.

14. The method according to claim 1, further comprising a step of forming a fourth single crystalline semiconductor having a strain on the third single crystalline semiconductor.

15. A method of manufacturing a semiconductor substrate, the method comprising:
   a growing step of growing a second single crystalline semiconductor on a first single crystalline semiconductor;
   a blocking layer forming step of forming a porous layer as a blocking layer in a surface of the second single crystalline semiconductor; and
   a relaxing step of generating crystal defects at a portion deeper than the blocking layer, after the blocking layer is formed, to relax a stress acting on the second single crystalline semiconductor,
   wherein the blocking layer prevents the crystal defects at the portion deeper than the blocking layer from propagating to a surface of the second single crystalline semiconductor,
   wherein the relaxing step includes a step of repeating increasing and decreasing a temperature a plurality of times and/or a step of growing a third single crystalline semiconductor on the second single crystalline semiconductor to exceed a critical film thickness for introducing misfit dislocations.

* * * * *